United States Patent
Yamaoka et al.

(10) Patent No.: US 9,874,814 B2
(45) Date of Patent: Jan. 23, 2018

(54) METHOD FOR PRODUCING TOUCH INPUT SENSOR AND PHOTOSENSITVE CONDUCTIVE FILM

(71) Applicant: NISSHA PRINTING CO., LTD., Kyoto-shi (JP)

(72) Inventors: Tomohiro Yamaoka, Kyoto (JP); Ryomei Omote, Kyoto (JP); Hayato Nakaya, Kyoto (JP); Takeshi Nishimura, Kyoto (JP); Yoshitaka Emoto, Kyoto (JP)

(73) Assignee: NISSHA PRINTING CO., LTD., Kyoto-shi (JP)

( * ) Notice: Subject to any disclaimer, the term of this patent is extended or adjusted under 35 U.S.C. 154(b) by 0 days.

(21) Appl. No.: 15/477,937

(22) Filed: Apr. 3, 2017

(65) Prior Publication Data
US 2017/0205917 A1 Jul. 20, 2017

Related U.S. Application Data

(63) Continuation of application No. PCT/JP2015/084510, filed on Dec. 9, 2015.

(30) Foreign Application Priority Data

Jan. 13, 2015 (JP) ................. 2015-004553

(51) Int. Cl.
*G03F 7/20* (2006.01)
*G06F 3/044* (2006.01)
(Continued)

(52) U.S. Cl.
CPC ............ *G03F 7/2032* (2013.01); *B32B 5/028* (2013.01); *B32B 7/02* (2013.01); *B32B 27/12* (2013.01);
(Continued)

(58) Field of Classification Search
CPC .... G03F 7/2002; G03F 7/2022; G03F 7/2024; G03F 7/2032
See application file for complete search history.

(56) References Cited

U.S. PATENT DOCUMENTS

2005/0260523 A1* 11/2005 Juan ...................... G03F 7/0007
430/270.1
2006/0025549 A1* 2/2006 Kim ..................... C09D 133/14
526/319
(Continued)

FOREIGN PATENT DOCUMENTS

JP 2010-198103 A 9/2010
JP 2012-194644 A 10/2012
(Continued)

OTHER PUBLICATIONS

International Search Report dated Mar. 1, 2016 in PCT/JP2015/084510 filed Dec. 9, 2015.

*Primary Examiner* — Kathleen Duda
(74) *Attorney, Agent, or Firm* — Oblon, McClelland, Maier & Neustadt, L.L.P.

(57) ABSTRACT

A method for producing a touch input sensor includes stacking an intermediate resin layer (33) containing a photosensitive resin and an ultraviolet absorber and a transparent conductive film (32) on both surfaces of a transparent substrate (10) in that order, performing a pattern exposure with ultraviolet rays (L) applied to both surface sides, and performing developing to form a transparent electrode formed of the transparent conductive film (32) on both surfaces of the transparent substrate (10).

10 Claims, 5 Drawing Sheets

(51) Int. Cl.
  *B32B 37/14*  (2006.01)
  *B32B 38/00*  (2006.01)
  *B32B 7/02*  (2006.01)
  *B32B 5/02*  (2006.01)
  *B32B 27/12*  (2006.01)
  *B32B 27/30*  (2006.01)
  *B32B 27/40*  (2006.01)
  *B32B 27/28*  (2006.01)
  *B32B 27/36*  (2006.01)
  *B32B 27/34*  (2006.01)
  *B32B 27/38*  (2006.01)
  *G02B 5/20*  (2006.01)
  *G02B 5/22*  (2006.01)

(52) U.S. Cl.
  CPC .......... *B32B 27/283* (2013.01); *B32B 27/306* (2013.01); *B32B 27/34* (2013.01); *B32B 27/36* (2013.01); *B32B 27/38* (2013.01); *B32B 27/40* (2013.01); *B32B 37/14* (2013.01); *B32B 38/0008* (2013.01); *G03F 7/2002* (2013.01); *G03F 7/70058* (2013.01); *G06F 3/044* (2013.01); *B32B 2250/05* (2013.01); *B32B 2250/40* (2013.01); *B32B 2262/103* (2013.01); *B32B 2307/202* (2013.01); *B32B 2307/412* (2013.01); *B32B 2307/42* (2013.01); *B32B 2310/0831* (2013.01); *B32B 2311/08* (2013.01); *B32B 2329/00* (2013.01); *B32B 2363/00* (2013.01); *B32B 2367/00* (2013.01); *B32B 2375/00* (2013.01); *B32B 2377/00* (2013.01); *B32B 2383/00* (2013.01); *B32B 2457/208* (2013.01); *G02B 5/208* (2013.01); *G02B 5/22* (2013.01); *G06F 2203/04103* (2013.01)

(56) References Cited

U.S. PATENT DOCUMENTS

| | | | |
|---|---|---|---|
| 2010/0261116 A1* | 10/2010 | Kim | G03F 7/0035 430/270.1 |
| 2014/0327889 A1 | 11/2014 | Yamazaki et al. | |
| 2015/0271919 A1 | 9/2015 | Yamazaki et al. | |
| 2016/0246394 A1 | 8/2016 | Yamazaki et al. | |

FOREIGN PATENT DOCUMENTS

| | | |
|---|---|---|
| JP | 2012-203565 A | 10/2012 |
| JP | 2013-109682 A | 6/2013 |
| JP | 2013-156655 A | 8/2013 |

* cited by examiner

METHOD FOR PRODUCING TOUCH INPUT SENSOR AND PHOTOSENSITVE CONDUCTIVE FILM

CROSS-REFERENCE TO RELATED APPLICATIONS

This application is a continuation of International Application No. PCT/JP2015/084510, filed Dec. 9, 2015, which claims priority to Japanese Application No. 2015-004553, filed Jan. 13, 2015, the entire contents of which are incorporated herein by reference.

BACKGROUND OF THE DISCLOSURE

1. Field of the Disclosure

The present disclosure relates to a method for producing a touch input sensor and to a photosensitive conductive film that can be used in the method.

2. Description of the Related Art

A touch input sensor such as a touch panel is used, for example, as an input device included in an electronic device such as a multifunctional mobile phone (smartphone) or a mobile game player. For example, as disclosed in Japanese Unexamined Patent Application Publication No. 2013-156655 (Patent Literature 1), a touch input sensor includes a transparent substrate (substrate 20) and transparent electrodes (transparent electrodes 103 and 104) for respectively detecting an X-coordinate and a Y-coordinate. The touch input sensor disclosed in Patent Literature 1 is produced through a process including stacking a photosensitive resin layer and a conductive film on a substrate, subjecting the resulting laminate to a pattern exposure, exposing uncured portions in the presence of oxygen, and subsequently performing developing to form transparent electrodes formed in a conductive pattern.

In the production method described in Patent Literature 1, transparent electrodes for detecting the X-coordinate are formed through the steps of "lamination, pattern exposure, exposure in the presence of oxygen, and developing", and transparent electrodes for detecting the Y-coordinate are formed through steps similar to the above steps (refer to paragraph 0125 in Patent Literature 1). However, in this production method, for example, it is necessary to perform an exposure step four times in total, resulting in an increase in the number of steps. Furthermore, since it is necessary to remove a base film after the pattern exposure, there are many restrictions for apparatuses used in the method. Therefore, the production method may be disadvantageous in view of practical use. In addition, the alignment of a transparent electrode for detecting the X-coordinate and a transparent electrode for detecting the Y-coordinate is difficult in some cases.

SUMMARY OF THE DISCLOSURE

It is desirable to provide a method for producing a touch input sensor, the method capable of simply producing a touch input sensor and easily aligning a pair of transparent electrodes with each other. It is also desirable to provide a photosensitive conductive film suitable for use in such a method.

A method for producing a touch input sensor according to the present disclosure includes stacking an intermediate resin layer containing a photosensitive resin and an ultraviolet absorber and a transparent conductive film on both surfaces of a transparent substrate in that order from the transparent substrate side; disposing a mask so as to cover the intermediate resin layer and the transparent conductive film on both surface sides, and performing a pattern exposure with ultraviolet rays applied to both surface sides; and performing developing to form a transparent electrode formed of the transparent conductive film on both surfaces of the transparent substrate.

A photosensitive conductive film according to the present disclosure includes a base film; a transparent conductive film disposed on the base film; and a photosensitive layer having a UV-cut function, the photosensitive layer being disposed on the transparent conductive film and containing a photosensitive resin and an ultraviolet absorber.

Further features and advantages of technologies according to present disclosure will become more apparent from the following description of exemplary embodiments.

DESCRIPTION OF THE PREFERRED EMBODIMENTS

Figure 1:
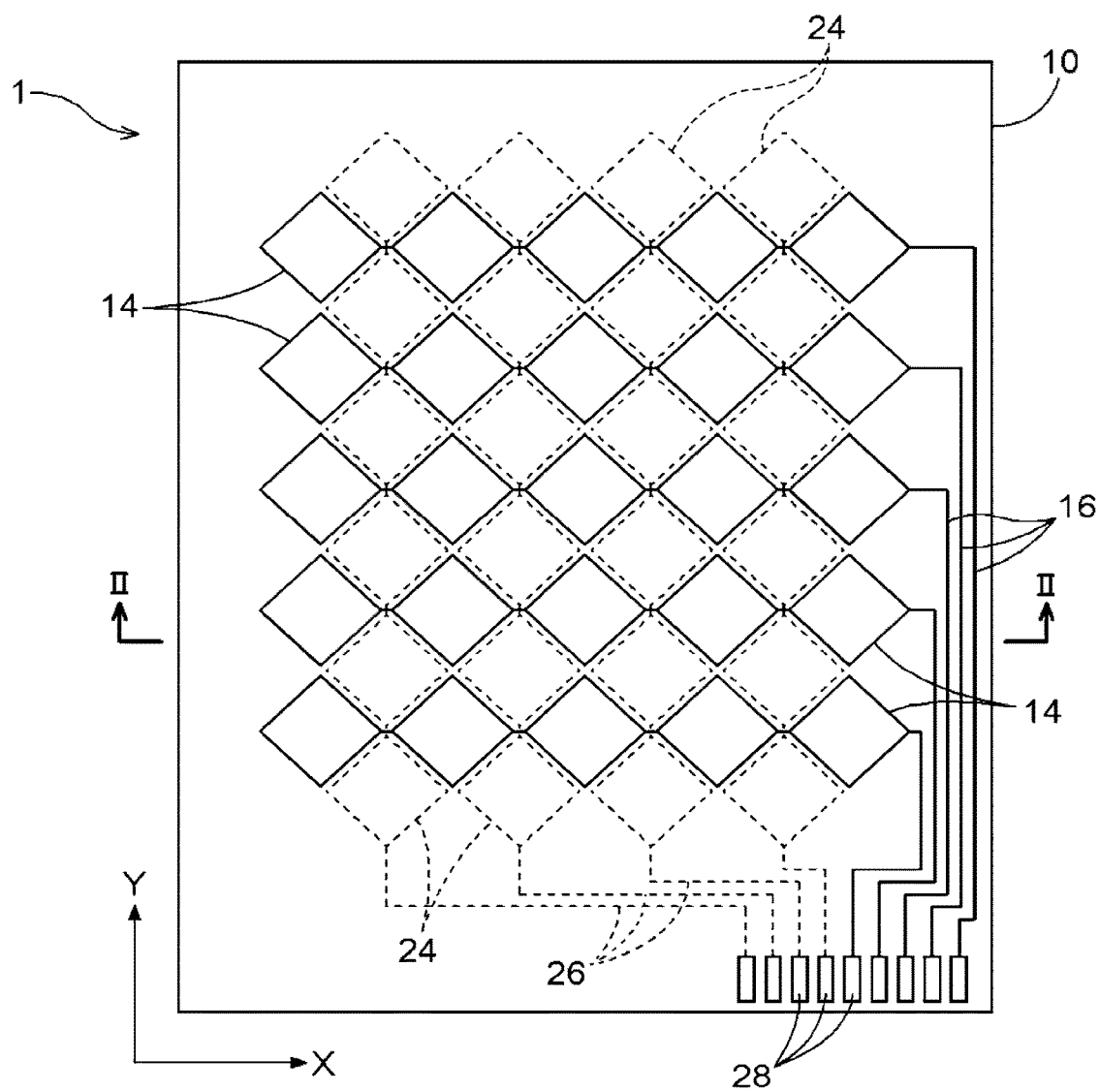
FIG. 1 is a plan view of a touch input sensor according to an embodiment.

Embodiments of the present disclosure will now be described. However, the scope of the present disclosure is not limited by the embodiments described below. In the description below, part of a description of the mechanism of an action includes an assumption, and it is to be understood that the scope of the present disclosure is not limited by the correctness or incorrectness of the assumption.

In the drawings referred to in the description below, the reduction scale, the dimensional ratios in the up-down direction and in the left-right direction, and the like may be shown in such a manner that they are different from those of actual products from the viewpoint of, for example, simplifying illustrations and facilitating understanding. With regard to each component that is to be provided as a plurality of components, the specific number referred to in the description below and illustrated in the corresponding drawing is merely an example, and the number may be a number other than the exemplified number.

A touch input sensor 1 according to the present embodiment is, for example, a touch panel included in an electronic device such as a multifunctional mobile phone (smartphone)

or a mobile game player and functioning as an input device. In such an electronic device, the touch input sensor 1 is used in a state where the touch input sensor 1 is overlapped with a display device including, for example, a liquid crystal display panel or an organic electroluminescence (EL) display panel. A method for producing the touch input sensor 1 according to the present embodiment will now be described in detail.

Figure 2:
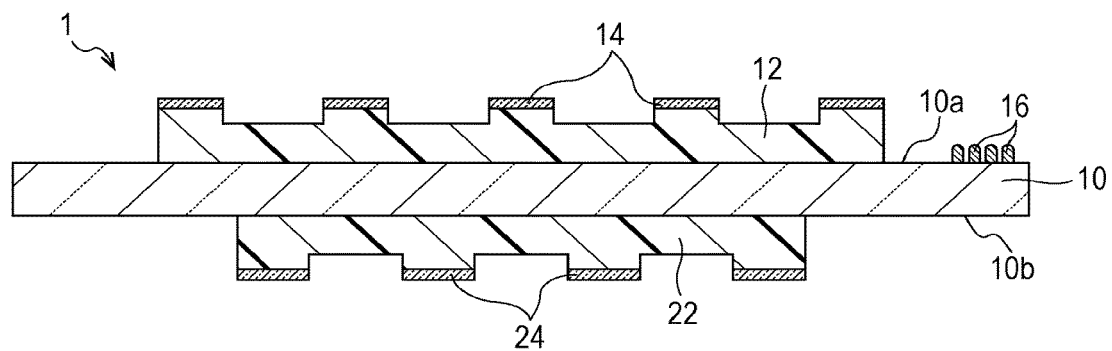
FIG. 2 is a sectional view taken along line II-II in FIG. 1.

As illustrated in FIGS. 1 and 2, the touch input sensor 1 includes a transparent substrate 10, supporting layers 12 and 22, transparent electrodes 14 and 24, and wiring lines 16 and 26. A first supporting layer 12, first transparent electrodes 14, and first wiring lines 16 are disposed on one surface (first surface 10*a*) side of the transparent substrate 10. A second supporting layer 22, second transparent electrodes 24, and second wiring lines 26 are disposed on the other surface (second surface 10*b*) side of the transparent substrate 10. On the first surface 10*a* side of the transparent substrate 10, the first supporting layer 12 and the first transparent electrodes 14 are stacked on the transparent substrate 10 in that order. On the second surface 10*b* side of the transparent substrate 10, the second supporting layer 22 and the second transparent electrodes 24 are stacked on the transparent substrate 10 in that order. The touch input sensor 1 of the present embodiment includes the transparent electrodes 14 and 24 on both surfaces of the single transparent substrate 10. This structure realizes a reduction in the thickness of the sensor as a whole.

The transparent substrate 10 is a component functioning as a base for providing the first transparent electrodes 14 and the second transparent electrodes 24. The transparent substrate 10 is preferably formed of a material having, for example, flexibility and insulating properties in addition to transparency. The transparent substrate 10 may be formed of a general-purpose resin such as polyethylene terephthalate or an acrylic resin, a general-purpose engineering plastic such as a polyacetal resin or a polycarbonate resin, or a super engineering plastic such as a polysulfone resin or a polyphenylene sulfide resin. In the present embodiment, the transparent substrate 10 is formed of a polyethylene terephthalate film. The transparent substrate 10 may be formed of a glass substrate or the like. The thickness of the transparent substrate 10 is, for example, 25 to 100 μm.

The first supporting layer 12 is disposed on the first surface 10*a* of the transparent substrate 10. A plurality of (five, in this embodiment) first transparent electrodes 14 are disposed on the first supporting layer 12. Specifically, a plurality of first transparent electrodes 14 are provided on the first surface 10*a* of the transparent substrate 10 with the first supporting layer 12 therebetween. As illustrated in FIG. 1, each of the plurality of first transparent electrodes 14 is formed by connecting a plurality of (five, in this embodiment) rhombic electrodes together in an X-axis direction, the rhombic electrodes being arranged in a line in the X-axis direction. Each of the first transparent electrodes 14 is formed so as to extend in the X-axis direction as a whole. The plurality of first transparent electrodes 14 are disposed in parallel with each other so as to be arranged in a line in a Y-axis direction.

The second supporting layer 22 is disposed on the second surface 10*b* of the transparent substrate 10. A plurality of (four, in this embodiment) second transparent electrodes 24 are disposed on the second supporting layer 22. Specifically, a plurality of second transparent electrodes 24 are provided on the second surface 10*b* of the transparent substrate 10 with the second supporting layer 22 therebetween. As illustrated in FIG. 1, each of the plurality of second transparent electrodes 24 is formed by connecting a plurality of (six, in this embodiment) rhombic electrodes together in the Y-axis direction, the rhombic electrodes being arranged in a line in the Y-axis direction that intersects (in this embodiment, that is orthogonal to) the X-axis direction. Each of the second transparent electrodes 24 is formed so as to extend in the Y-axis direction as a whole. The plurality of second transparent electrodes 24 are disposed in parallel with each other so as to be arranged in a line in the X-axis direction.

The plurality of rhombic electrodes that form a first transparent electrode 14 and the plurality of rhombic electrodes that form a second transparent electrode 24 are arranged in a complementary positional relationship in plan view (in a state viewed in a direction orthogonal to a plane on which the touch input sensor 1 extends). Specifically, the rhombic electrodes that form the second transparent electrode 24 are arranged in a non-arrangement region of the rhombic electrodes that form the first transparent electrode 14, and the rhombic electrodes that form the first transparent electrode 14 are arranged in a non-arrangement region of the rhombic electrodes that form the second transparent electrode 24. The plurality of first transparent electrodes 14 and the plurality of second transparent electrodes 24 are arranged so that all these electrodes cover substantially the whole display area of the display device.

The first supporting layer 12 and the second supporting layer 22 are preferably formed by using a resin material having high transparency and good electrical insulating properties. The first supporting layer 12 and the second supporting layer 22 are preferably formed by using a resin material having an appropriate hardness and appropriate mechanical strength. In the present embodiment, the supporting layers 12 and 22 are mainly formed of a photosensitive resin (photo-curable resin) described below.

The first transparent electrodes 14 and the second transparent electrodes 24 are formed by using a material having good conductivity in addition to transparency. The transparent electrodes 14 and 24 are formed of, for example, a metal oxide such as tin oxide, indium oxide, zinc oxide, or indium tin oxide (ITO); a metal nanowire formed of gold, silver, copper, nickel, an alloy thereof, or the like; a carbon nanotube; graphene; a metal mesh; or a conductive polymer. The transparent electrodes 14 and 24 are transparent conductive layers formed by using any of these materials. In the present embodiment, the transparent electrodes 14 and 24 are formed of silver nanowires.

Electrostatic capacitances of the first transparent electrodes 14 and the second transparent electrodes 24 change in accordance with approach/separation of an object to be detected (a finger of the user or a conductor such as a stylus). Note that the term "electrostatic capacitance" refers to a concept that includes both a self capacitance and a mutual capacitance. Specifically, regarding a first transparent electrode 14, the self capacitance of the first transparent electrode 14 or the mutual capacitance between the first transparent electrode 14 and a second transparent electrode 24 changes in accordance with approach/separation of an object to be detected. Regarding a second transparent electrode 24, the self capacitance of the second transparent electrode 24 or the mutual capacitance between the second transparent electrode 24 and a first transparent electrode 14 changes in accordance with approach/separation of an object to be detected.

The first transparent electrodes 14 are connected to corresponding first wiring lines 16. The second transparent electrodes 24 are connected to corresponding second wiring lines 26. The wiring lines 16 and 26 are formed by using a conductive paste containing, for example, a metal such as gold, silver, copper, or nickel, or carbon. Connection terminals 28 are provided on ends of the corresponding wiring lines 16 and 26, the ends being located on the opposite side of the transparent electrodes 14 and 24. The transparent electrodes 14 and 24 are connected to a controller (not shown) through the wiring lines 16 and 26 and the connection terminals 28. A touch operation and a touch position by the user can be detected by detecting, with the controller, a current flowing in accordance with a change in the electrostatic capacitance generated in the transparent electrodes 14 and 24.

A method for producing the touch input sensor 1 includes a preparation step, an adhesion step, a pattern exposure step, a developing step, and a whole-surface exposure step. In the present embodiment, the method further includes a deactivation treatment step and a wiring formation step. The preparation step, the adhesion step, the pattern exposure step, the developing step, the deactivation treatment step, the whole-surface exposure step, and the wiring formation step are performed in that order.

The preparation step is a step of preparing intermediate materials used in the production method of the present embodiment. In the preparation step, a transparent substrate 10 and photosensitive conductive films 3 serving as bases of supporting layers 12 and 22 and transparent electrodes 14 and 24 are prepared. The transparent substrate 10 is provided, for example, in a state where a protective film is attached to both surfaces of the transparent substrate 10 (not shown). The transparent substrate 10 preferably has, for example, a minimum light transmittance of 80% or more (more preferably 85% or more) in a wavelength range of 450 to 650 nm. The use of such a transparent substrate 10 easily realizes a high brightness of a touch panel display or the like.

Figure 3:
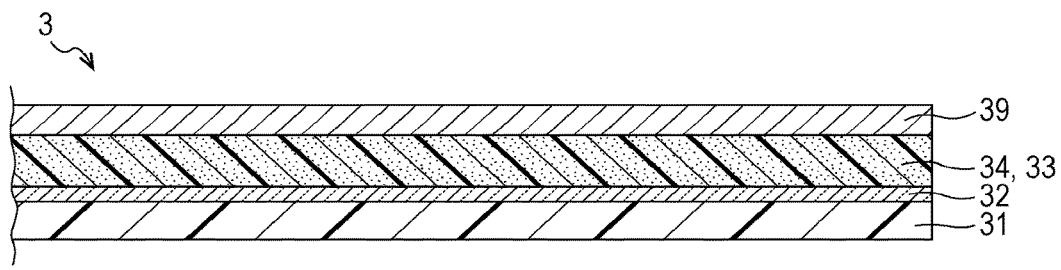
FIG. 3 is a sectional view illustrating a photosensitive conductive film.

As illustrated in FIG. 3, each of the photosensitive conductive films 3 is formed as a laminate of a base film 31, a transparent conductive film 32, and an intermediate resin layer 33. The photosensitive conductive film 3 includes the base film 31, the transparent conductive film 32 disposed on the base film 31, and the intermediate resin layer 33 disposed on the transparent conductive film 32. In the present embodiment, a separator 39 is disposed on the intermediate resin layer 33.

The base film 31 may be formed by using a polymer film. The base film 31 is formed by using a material having good heat resistance and good solvent resistance. The base film 31 may be formed of, for example, a polyethylene terephthalate film, a polyethylene film, a polypropylene film, or a polycarbonate film. In the present embodiment, the base film 31 is formed of a polyethylene terephthalate film. The thickness of the base film 31 may be, for example, 5 to 300 μm.

The transparent conductive film 32 is a layer serving as a base of the first transparent electrodes 14 and the second transparent electrodes 24. The transparent conductive film 32 may be a transparent conductive layer formed of, for example, a metal oxide such as tin oxide, indium oxide, zinc oxide, or ITO; a metal nanowire formed of gold, silver, copper, nickel, an alloy thereof, or the like; a carbon nanotube; graphene; a metal mesh; or a conductive polymer. In the present embodiment, a thin-film layer including silver nanowires is used as the transparent conductive film 32. Silver nanowires are fine silver wires having an outer diameter on the order of nanometers (for example, several nanometers to several hundreds of nanometers). Silver nanowires are very small and are invisible to the human eyes, and thus a thin-film layer of silver nanowires have good transparency. The transparent conductive film 32 may be formed so as to have a mesh-like structure in which silver nanowires arranged in a planar distribution are in contact with each other. With this structure, the conductivity in the planar direction can be made isotropic while the thickness of the transparent conductive film 32 is minimized. Such a transparent conductive film 32 is suitable because the transparent conductive film 32 can also be used in the production of a flexible touch input sensor 1. The transparent conductive film 32 can be formed over the entire surface of the base film 31 by, for example, a vacuum evaporation method, a sputtering method, an ion plating method, a chemical vapor deposition (CVD) method, or a roll coater method. The thickness of the transparent conductive film 32 may be, for example, 5 to 5,000 nm.

The intermediate resin layer 33 is a layer serving as a base of the first supporting layer 12 and the second supporting layer 22. In the present embodiment, the intermediate resin layer 33 is formed as a layer including a photosensitive resin and an ultraviolet absorber.

Any of a negative-type photosensitive resin and a positive-type photosensitive resin may be used as the photosensitive resin as long as the resin has a property of subjecting to a chemical change or a structural change by application of active rays (specifically, ultraviolet rays). A negative-type photosensitive resin is used in the present embodiment. A photosensitive resin composition that forms a negative-type photosensitive resin contains, for example, a binder resin, a photopolymerizable compound having an ethylenically unsaturated bond, and a photoinitiator.

Examples of the binder resin include acrylic resins, styrene resins, epoxy resins, amide resins, amide-epoxy resins, alkyd resins, phenolic resins, ester resins, urethane resins, epoxy acrylate resins obtained by a reaction between an epoxy resin and (meth)acrylic acid, and acid-modified epoxy acrylate resins obtained by a reaction between an epoxy acrylate resin and an acid anhydride. These binder resins may be used alone or in combination of two or more resins.

Examples of the photopolymerizable compound having an ethylenically unsaturated bond include compounds obtained by reacting an α,β-unsaturated carboxylic acid with a polyhydric alcohol, compounds obtained by reacting an α,β-unsaturated carboxylic acid with a glycidyl group-containing compound, urethane monomers such as a (meth) acrylate compound having a urethane bond, phthalic acid-based compounds, and alkyl (meth)acrylates. These photopolymerizable compounds may be used alone or in combination of two or more compounds.

Examples of the photoinitiator include radical polymerization initiators such as aromatic ketones, benzoin ether compounds, benzoin compounds, oxime ester compounds, benzil derivatives, 2,4,5-triaryl imidazole dimers, acridine derivatives, N-phenylglycine, N-phenylglycine derivatives, coumarin-based compounds, and oxazole-based compounds. These photoinitiators may be used alone or in combination of two or more thereof.

The photosensitive resin composition may further contain various additives as required. Examples of the additives include a plasticizer, a filler, an antifoaming agent, a flame retardant, a stabilizer, an adhesiveness-imparting agent, a leveling agent, a release-accelerating agent, an antioxidant, a fragrance material, an imaging agent, and a thermal cross-linking agent. These additives may be contained alone or in combination of two or more thereof.

Any compound may be used as the ultraviolet absorber as long as the compound absorbs ultraviolet rays which are active rays, converts the energy of the ultraviolet rays to heat, infrared rays, or the like, and releases the heat, infrared rays, or the like. From the viewpoint of transparency, organic ultraviolet absorbers are preferable. Examples of the organic ultraviolet absorbers include benzotriazole-based ultraviolet absorbers, benzophenone-based ultraviolet absorbers, benzoate-based ultraviolet absorbers, salicylic acid-based ultraviolet absorbers, triazine-based ultraviolet absorbers, and cyanoacrylate-based ultraviolet absorbers. These ultraviolet absorbers may be used alone or in combination of two or more thereof. Compounds having, in one molecule thereof, two or more basic structures of the above compounds may also be used.

The amount of the ultraviolet absorber added is not particularly limited, but may be, for example, 1% or more and 10% or less on a weight basis relative to the total of the intermediate resin layer 33. When the amount of the ultraviolet absorber added is less than 1%, it may not be possible to exhibit a satisfactory UV-cut function. When the amount of the ultraviolet absorber added exceeds 10%, transparency of the touch input sensor 1 may decrease. The amount of the ultraviolet absorber added is more preferably 3% or more and 7% or less.

In the intermediate resin layer 33, the photosensitive resin and the ultraviolet absorber may be present in a separate state or a mixed state. In the present embodiment, in the intermediate resin layer 33, the ultraviolet absorber is dispersed and held in a photosensitive resin layer 34 formed of a photosensitive resin composition. In other words, in the present embodiment, the intermediate resin layer 33 is formed of the photosensitive resin composition having a UV-cut function and containing a binder resin, a photopolymerizable compound having an ethylenically unsaturated bond, a photoinitiator, and an ultraviolet absorber. In the present embodiment, the ultraviolet absorber is substantially uniformly dispersed in the photosensitive resin layer 34. In the present embodiment, the intermediate resin layer 33 corresponds to a "photosensitive layer having a UV-cut function".

The intermediate resin layer 33 can be formed by, for example, applying a solution of the resin composition dissolved in a solvent onto a transparent conductive film 32 formed on a base film 31, and then conducting drying. For example, methanol, ethanol, acetone, methyl ethyl ketone, toluene, N,N-dimethylformamide, or propylene glycol monomethyl ether can be used as the solvent. These solvents may be used alone or as a mixed solvent of two or more thereof. The application of the solution of the resin composition can be performed by a known method such as a roll coating method, a comma coating method, a gravure coating method, an air knife method, a die coating method, a bar coating method, or a spray coating method. The drying can be performed, for example, by using a hot-air convection dryer. The intermediate resin layer 33 may have a thickness of, for example, 1 to 200 μm after drying.

The separator 39 is provided so as to facilitate handling of the photosensitive conductive film 3. The separator 39 may be formed by using a material (for example, polyethylene terephthalate) the same as the base film 31 described above.

The photosensitive conductive film 3 that is mainly formed of a laminate including the base film 31, the transparent conductive film 32, and the intermediate resin layer 33 is also referred to as a "dry film resist (DFR)". The photosensitive conductive film 3 preferably has, for example, a minimum light transmittance of 80% or more (more preferably 85% or more) in a wavelength range of 450 to 650 nm. The use of such a photosensitive conductive film 3 easily realizes a high brightness of a touch panel display or the like. In the present embodiment, two photosensitive conductive films 3 each having such a structure are prepared for a single transparent substrate 10.

Figure 4:
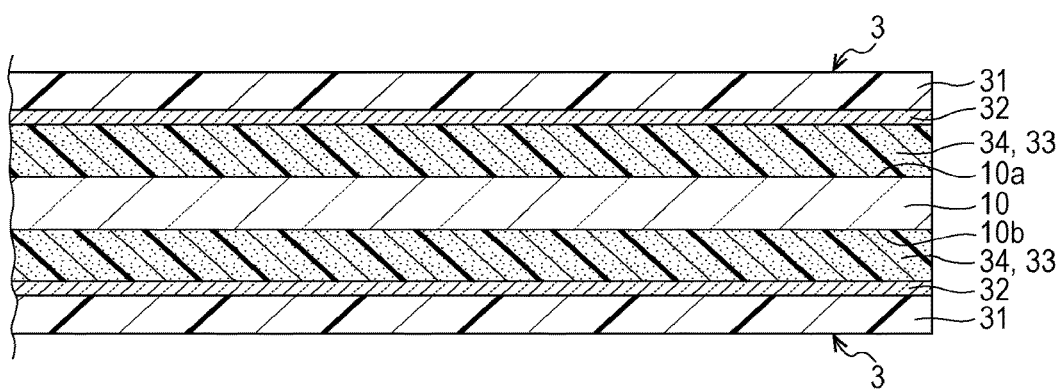
FIG. 4 is a schematic view illustrating an adhesion step.

The adhesion step is a step of adhering a single transparent substrate 10 to two photosensitive conductive films 3, the substrate 10 and the photosensitive conductive films 3 being prepared in the preparation step. In the adhesion step, protective films on both surfaces of the transparent substrate 10 are detached to expose the first surface 10a and the second surface 10b of the transparent substrate 10. The separator 39 is detached from each of the two photosensitive conductive films 3 to expose the intermediate resin layer 33. Subsequently, as illustrated in FIG. 4, the two photosensitive conductive films 3 are allowed to adhere to the exposed surfaces of the transparent substrate 10 so that the exposed intermediate resin layers 33 face the surfaces of the transparent substrate 10. In this step, the two photosensitive conductive films 3 are allowed to adhere to both surfaces of the transparent substrate 10 by, for example, performing pressure-bonding (thermal lamination) while heating at a temperature of 80° C. to 120° C. In this manner, the intermediate resin layer 33 containing a photosensitive resin and an ultraviolet absorber, the transparent conductive film 32, and the base film 31 are sequentially stacked on each of both surfaces of the transparent substrate 10 in that order from the transparent substrate 10 side. Note that the two base films 31 on both ends in a stacking direction may be detached.

Figure 5:
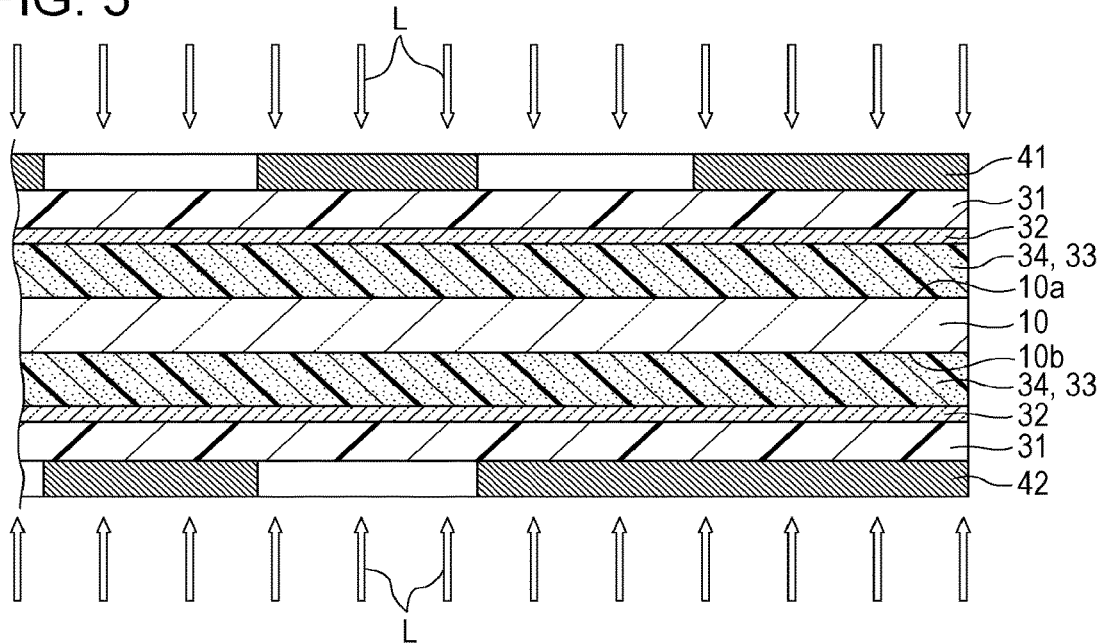
FIG. 5 is a schematic view illustrating a pattern exposure step.

The pattern exposure step is a step of subjecting the resulting laminate after the adhesion step to a first exposure. As illustrated in FIG. 5, in the pattern exposure step, masks 41 and 42 are disposed so as to cover the intermediate resin layers 33 and the transparent conductive films 32 on both surface sides, and a pattern exposure is performed from both surface sides. More specifically, a first mask (first photomask) 41 is disposed on the outside of the base film 31 on the first surface 10a side, and a second mask (second photomask) 42 is disposed on the outside of the base film 31 on the second surface 10b side. In this state, exposure is performed from both surface sides. The first mask 41 has a first transparent electrode formation pattern corresponding to the overall shape (refer to FIG. 1 of the first transparent electrodes 14 in plan view. The second mask 42 has a second transparent electrode formation pattern corresponding to the overall shape of the second transparent electrodes 24 in plan view. In the case where the photosensitive resin layers 34 included in the intermediate resin layers 33 are negative-type photosensitive resin layers as in the present embodiment, the first transparent electrode formation pattern and the second transparent electrode formation pattern are window portions (light-transmitting portions) formed in the corresponding masks 41 and 42.

The first mask 41 and the second mask 42 can be easily aligned with a high accuracy by using a mask alignment mechanism (including a position sensor and a position adjustment mechanism) provided in an exposure apparatus. Specifically, for example, alignment marks are formed in advance on the first mask 41 and the second mask 42. The relative positions of the alignment marks of the two masks 41 and 42 are detected with the position sensor such as a camera to obtain relative position information. The position adjustment mechanism relatively moves the two masks 41 and 42 on the basis of the obtained relative position information so that central positions of the alignment marks that form a pair overlap with each other. Thus, the first mask 41 and the second mask 42 are preferably fixed in position.

After the first mask 41 and the second mask 42 are fixed in position to the laminate after the adhesion step, ultraviolet rays L serving as active rays are radiated from both surface sides. The ultraviolet rays L can be radiated by using an ultraviolet radiation lamp. Both surfaces may be irradiated with the ultraviolet rays L at the same time. Alternatively, the surfaces may be sequentially irradiated with the ultraviolet rays L one by one. In the present embodiment, a double-surface simultaneous exposure is performed in order to reduce the cycle time. The exposure intensity and the exposure time of the ultraviolet rays L can be appropriately determined in accordance with photosensitive properties of the photosensitive resin layers 34 also in consideration of, for example, the effect of the ultraviolet absorber held in the photosensitive resin layers 34. In the present embodiment, the exposure is performed while the base films 31 are disposed on the surfaces of the transparent conductive films 32 without detaching the base films 31, and thus the pattern exposure step can be performed in air. In the case where the base films 31 have already been detached, the pattern exposure step is preferably performed in the presence of non-oxygen (for example, in the presence of an inert gas or in a vacuum).

Figure 6:
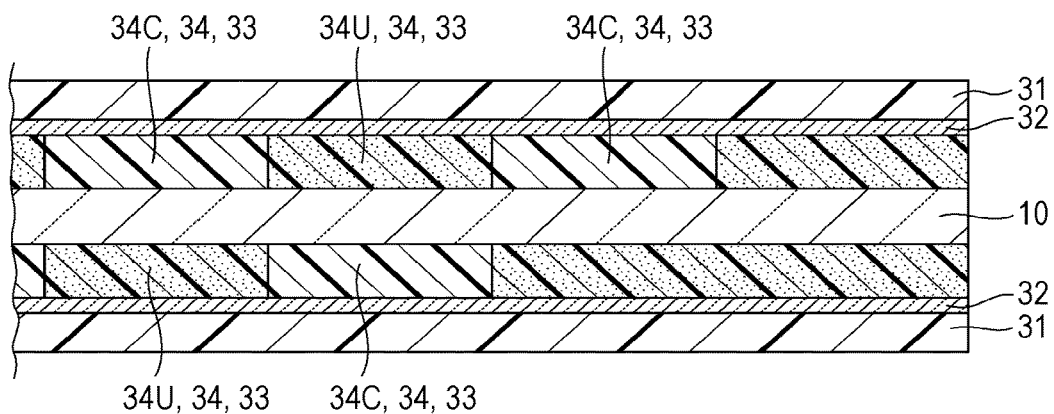
FIG. 6 is a schematic view illustrating a state when the pattern exposure step is completed.

In the pattern exposure step, on the first surface 10a side of the transparent substrate 10, the ultraviolet rays L are radiated through the first mask 41 in the shape of an image, thus exposing the intermediate resin layer 33 (photosensitive resin layer 34) with a pattern corresponding to the shape of the first transparent electrodes 14 in plan view. Accordingly, portions of the photosensitive resin layer 34, the portions being exposed to the ultraviolet rays L, are cured so as to correspond to the shape of the first transparent electrodes 14 in plan view, and the other portions are maintained while remaining uncured (refer to FIG. 6). In the photosensitive resin layer 34 illustrated in FIGS. 6 to 10, portions that have been cured (cured portions 34C) and portions that have not yet been cured (uncured portions 34U) are indicated by different hatchings. In this step, in the present embodiment, since the intermediate resin layer 33 contains a photosensitive resin and an ultraviolet absorber, the ultraviolet rays L radiated from the first surface 10a side cure the photosensitive resin layer 34 on the first surface 10a side but are absorbed by the ultraviolet absorber and are hardly transmitted to the second surface 10b side of the transparent substrate 10. Therefore, curing of the intermediate resin layer 33 disposed on the second surface 10b side due to the action of the ultraviolet rays L radiated from the first surface 10a side hardly occurs.

On the second surface 10b side of the transparent substrate 10, the ultraviolet rays L are radiated through the second mask 42 in the shape of an image, thus exposing the intermediate resin layer 33 (photosensitive resin layer 34) with a pattern corresponding to the shape of the second transparent electrodes 24 in plan view. Accordingly, portions of the photosensitive resin layer 34, the portions being exposed to the ultraviolet rays L, are cured so as to correspond to the shape of the second transparent electrodes 24 in plan view, and the other portions are maintained while remaining uncured. In this step, the ultraviolet rays L radiated from the second surface 10b side cure the photosensitive resin layer 34 on the second surface 10b side but are absorbed by the ultraviolet absorber and are hardly transmitted to the first surface 10a side of the transparent substrate 10. Therefore, curing of the intermediate resin layer 33 disposed on the first surface 10a side due to the action of the ultraviolet rays L radiated from the second surface 10b side hardly occurs.

As described above, the mutual effect between patterning of the first transparent electrodes 14 and patterning of the second transparent electrodes 24 can be suppressed. Consequently, exposure interference is suppressed while performing the double-surface simultaneous exposure. Thus, patterning of the first transparent electrodes 14 and patterning of the second transparent electrodes 24 can be appropriately performed at the same time. The positional accuracy between the first transparent electrodes 14 forming a pattern and the second transparent electrodes 24 forming a pattern also becomes high in accordance with the accuracy of the positioning of the first mask 41 and the second mask 42. Note that in the pattern exposure step, it is sufficient that each of the photosensitive resin layers 34 is cured to the extent that the transparent conductive film 32 can be supported on the transparent substrate 10 with the photosensitive resin layer 34 therebetween, and the photosensitive resin layer 34 may not be completely cured. Therefore, even when an ultraviolet absorber is dispersed and held in the photosensitive resin layer 34 that forms the intermediate resin layer 33, there is no particular problem because a necessary hardness is obtained.

Figure 7:
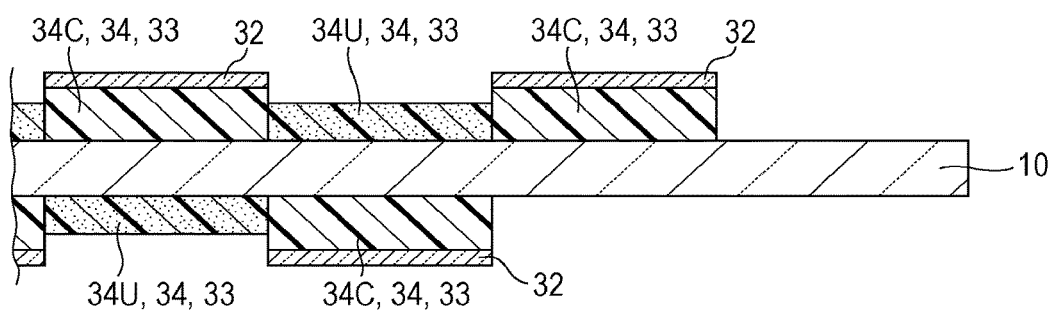
FIG. 7 is a schematic view illustrating a developing step.

The developing step is a step of subjecting the laminate after the pattern exposure step to a developing treatment. As illustrated in FIG. 7, in the developing step, the intermediate resin layer 33 (photosensitive resin layer 34) is developed to form first transparent electrodes 14 and second transparent electrodes 24 each formed of the transparent conductive film 32 having a pattern on both surfaces of the transparent substrate 10 (also refers to FIG. 10). The developing step can be performed by, for example, wet developing using a developing solution in a state where the base films 31 on both sides are detached. Specifically, first, a developing solution appropriate to chemical properties of the photosensitive resin layer 34 is prepared. For example, when an alkali development is performed, a sodium carbonate solution, a potassium hydroxide solution, an alkali ethylamino ethanol, tetramethylammonium hydroxide, diethanolamine, or the like may be used as the developing solution. For example, when an organic development is performed, a polar solvent such as N-methyl-2-pyrrolidone, N-acetyl-2-pyrrolidone, or N,N-dimethylacetamide may be used as the developing solution. These polar solvents may be used alone or in combination with another solvent such as water, methanol, or ethanol. The development may be performed, for example, by using a spray method, a dipping method, or a puddle method.

Figure 8:
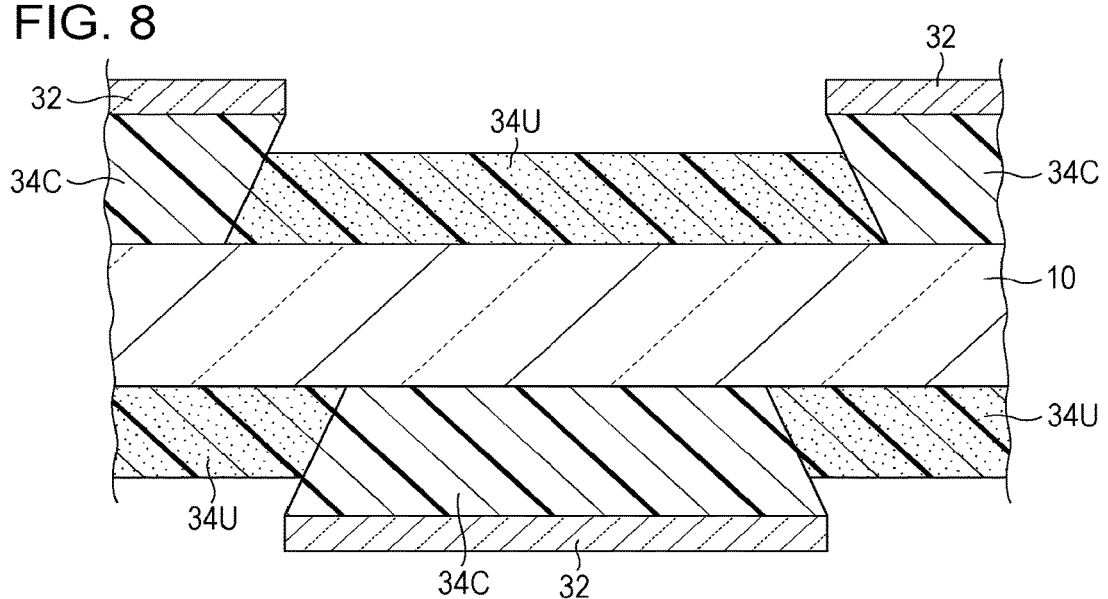
FIG. 8 is a partially enlarged view of FIG. 7.

In the developing step, the uncured portions 34U of the photosensitive resin layer 34, the uncured portions 34U still remaining in the uncured state after the completion of the pattern exposure step, are at least partially removed. In the present embodiment, of the uncured portions 34U of the photosensitive resin layer 34, at least surface layer portions (portions on the transparent conductive film 32 side) are removed. According to the studies conducted by the inventors of the present disclosure, deep layer portions (portions of the transparent substrate 10 side) of the uncured portions 34U of the photosensitive resin layer 34 may be sufficiently removed. In the present embodiment, the ultraviolet absorber is dispersed and held in the photosensitive resin layer 34 forming the intermediate resin layer 33. Accordingly, in the pattern exposure step, due to the ultraviolet absorber that is dispersed and held, curing of the photosensitive resin layer 34 on the deep layer side tends to be insufficient compared with the surface layer side. In particular, in a peripheral edge portion of an exposure region in the photosensitive resin layer 34, curing on the deep layer side tends to become insufficient compared with a central portion of the exposure region because there is no overlapping of exposure from the sides of regions that are covered by light-shielding portions of the masks 41 and 42. As a result, as illustrated in FIG. 8 in an exaggerated manner, the cured portions 34C of the photosensitive resin layer 34 tend to have inverted-cone shapes, and the relationship between a cured portion 34C and an uncured portion 34U tends to form an undercut shape. Therefore, in the developing step, the deep layer portions of the cured portions 34C of the photosensitive resin layer 34 are unlikely to be removed and may remain.

In order to completely cure the uncured portions 34U, which may remain as described above, in a post-process, the method according to the present embodiment additionally includes a deactivation treatment step. The deactivation treatment step is a step of deactivating the ultraviolet absorber contained in the intermediate resin layer 33. In the present embodiment, the deactivation treatment step is carried out by a heat treatment. In the deactivation treatment step, the whole laminate after the developing step is heated to a temperature higher than the thermal lamination temperature. For example, by heating the laminate to a temperature equal to or more than a thermal decomposition-starting temperature of the ultraviolet absorber (for example, 250° C. to 350° C.), the ultraviolet absorber contained in the intermediate resin layer 33 (dispersed and held in the photosensitive resin layer 34 in the present embodiment) is thermally deactivated. Thus, the UV-cut function of the ultraviolet absorber is deactivated.

Figure 9:
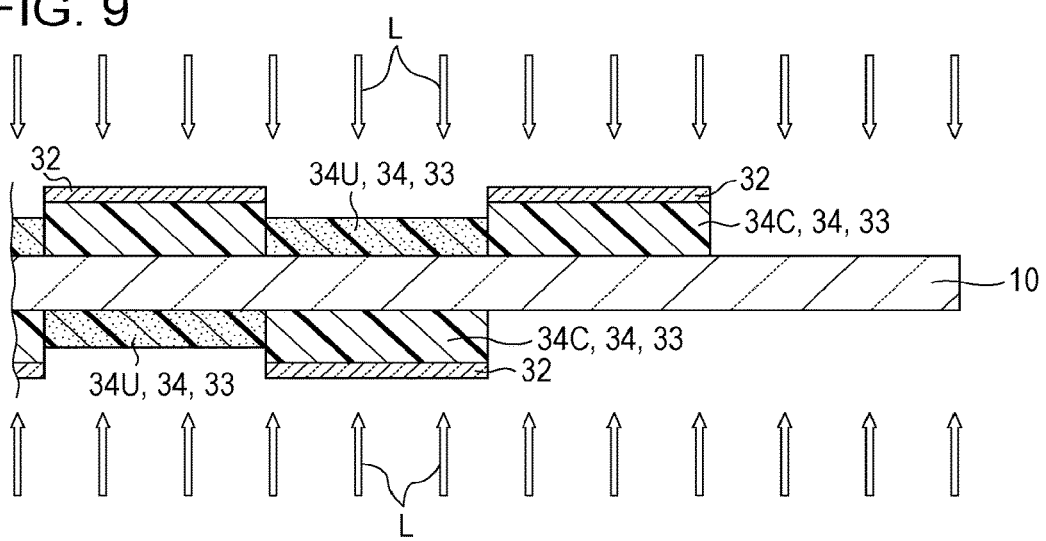
FIG. 9 is a schematic view illustrating a whole-surface exposure step.
Figure 10:
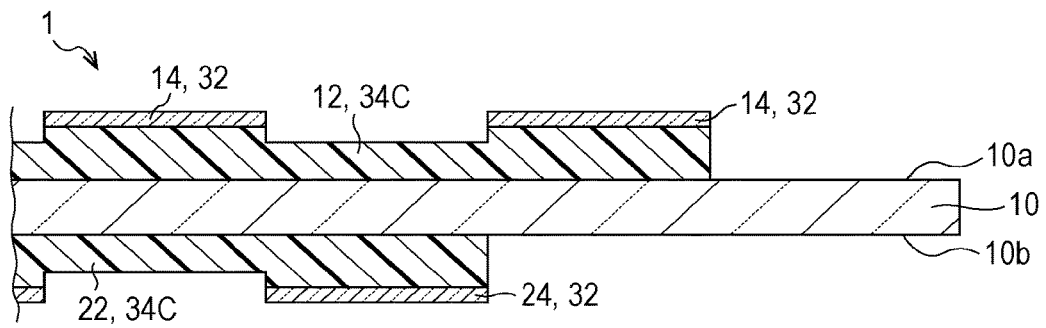
FIG. 10 is a schematic view illustrating a state when the whole-surface exposure step is completed.

The whole-surface exposure step is a step of subjecting the laminate after the deactivation treatment step to a second exposure (post exposure). As illustrated in FIG. 9, in the whole-surface exposure step, the whole surfaces of the intermediate resin layers 33 on both surface sides are irradiated with ultraviolet rays L without using a mask. The UV-cut function of the ultraviolet absorber has already been deactivated in the deactivation treatment step. Accordingly, in the whole-surface exposure step, the ultraviolet rays L may be radiated from both surface sides or may be radiated from only one surface side. In the present embodiment, in order to improve uniformity and reduce the cycle time, a double-surface simultaneous exposure is performed. Through the whole-surface exposure step, the entire photosensitive resin layers 34 including the uncured portions 34U, which may remain in the developing step, are completely cured. The cured photosensitive resin layers 34 become supporting layers 12 and 22 (refer to FIG. 10). The exposure intensity and the exposure time of the ultraviolet rays L can be appropriately determined in accordance with photosensitive properties of the photosensitive resin layers 34 also in consideration of, for example, the hardness required for the supporting layers 12 and 22 in the final product.

In the method according to the present embodiment, the uncured portions 34U (including the ultraviolet absorber), which may remain in the developing step, are used in a positive manner, and the uncured portions 34U are made to be curable over the entire surface in the deactivation treatment step so that the difference in level between the transparent electrodes 14 and 24 and non-electrode portions is suppressed to be small in the subsequent whole-surface exposure step. Accordingly, visual recognition of the patterns of the first transparent electrodes 14 and the second transparent electrodes 24 can be suppressed by a simple method. Therefore, visibility of a display device through the touch input sensor 1 is satisfactorily maintained. Furthermore, in the case where another functional layer such as a protective layer is provided on the touch input sensor 1, it is possible to suppress the mixing of gas bubbles (generation of bubble inclusion) when the touch input sensor 1 and the functional layer are bonded to each other.

The wiring formation step is a step of forming wiring lines 16 and 26 respectively extending from the transparent electrodes 14 and 24. In the wiring formation step, the wiring lines 16 and 26 are formed by a printing method using a conductive paste containing, for example, a metal such as gold, silver, copper, or nickel, or carbon. For example, a screen printing method or an ink-jet printing method may be employed as the printing method. In the case of the screen printing method, after the conductive paste is applied, patterning may be performed by laser irradiation or the like. In the case of the ink-jet printing method, since printing can be performed with a high positional accuracy, the wiring lines 16 and 26 can be directly formed. In the wiring formation step, a wiring protection layer that covers and protects the formed wiring lines 16 and 26 may be further formed.

Other Embodiments

Other embodiments of a photosensitive conductive film and a method for producing a touch input sensor will now be described. Note that configurations disclosed in embodiments below may be used in combination with configurations disclosed in other embodiments as long as no contradiction occurs.

Figure 11:
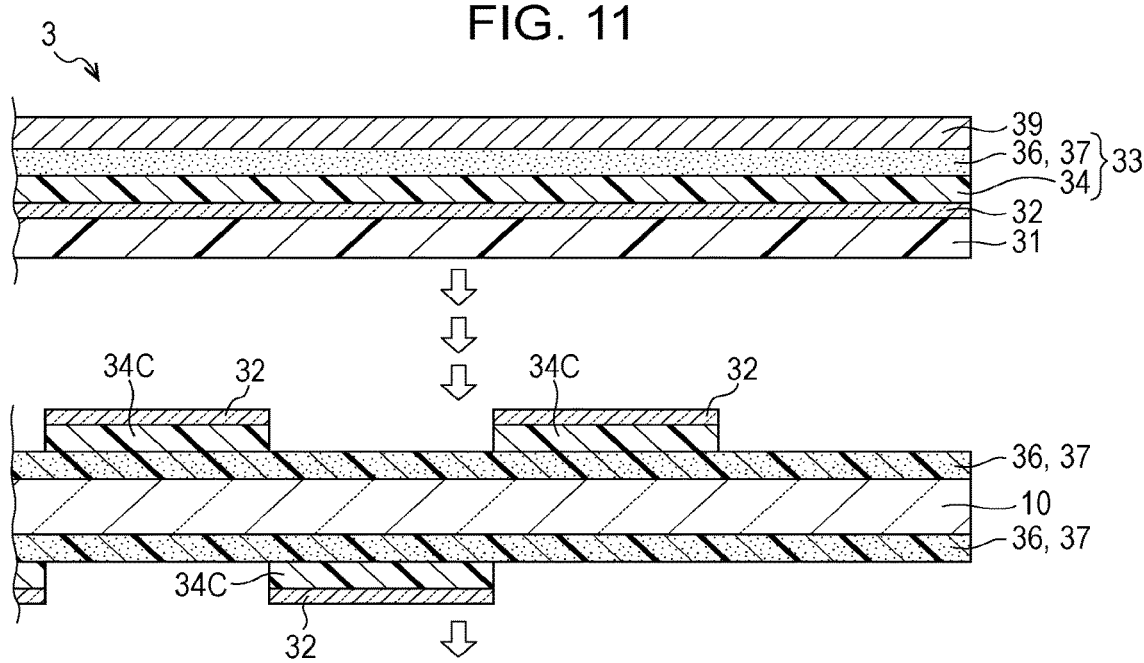
FIG. 11 includes sectional views illustrating another embodiment of a photosensitive conductive film and a touch input sensor.

(1) In the above embodiment, a description has been made of an example in which in the intermediate resin layer 33, a photosensitive resin and an ultraviolet absorber are present in a mixed state. However, embodiments of the present disclosure are not limited thereto. For example, as illustrated in FIG. 11, in an intermediate resin layer 33, a photosensitive resin and an ultraviolet absorber may be present in a separate state. In the embodiment illustrated in FIG. 11, in the intermediate resin layer 33, a photosensitive resin layer 34 and an ultraviolet absorber layer 37 are stacked so that the photosensitive resin layer 34 is located adjacent to the transparent conductive film 32. Also by using a photosensitive conductive film 3 having this structure, patterning of the first transparent electrodes 14 and patterning of the second transparent electrodes 24 can be appropriately performed at the same time by a double-surface simultaneous exposure. As in the embodiment illustrated in FIG. 11, the ultraviolet absorber layer 37 may be a non-photosensitive ultraviolet absorber layer 36. The non-photosensitive ultraviolet absorber layer 36 is formed in a state in which an ultraviolet absorber is dispersed in a non-photosensitive resin layer. Examples of the non-photosensitive resin include thermoplastic resins and pressure-sensitive adhesives (PSA). Considering the ease of handling, it is necessary that the photosensitive conductive film 3 have a certain thickness. When the photosensitive conductive film 3 includes the ultraviolet absorber layer 37 in a separate state, the thickness of the photosensitive resin layer 34 can be reduced by the thickness of the ultraviolet absorber layer 37. As a result, it is possible to realize a reduction in the difference in levels of the transparent electrodes 14 and 24 to be patterned. Use of the non-photosensitive ultraviolet absorber layer 36 in which an ultraviolet absorber is dispersed in a thermoplastic resin layer is advantageous in that the ultraviolet absorber layer 37 is easily bonded to the transparent substrate 10 during the thermal lamination in the adhesion step.

Examples of the thermoplastic resin include ethylene-vinyl acetate copolymer resins, polyamide resins, polyurethane resins, polyester resins, olefin resins, and acrylic resins. These thermoplastic resins may be used alone or in combination of two or more resins. Examples of the pressure-sensitive adhesive include acrylic adhesives, rubber adhesives, vinyl alkyl ether adhesives, silicone adhesives, polyester adhesives, polyamide adhesives, urethane adhesives, fluorine adhesives, epoxy adhesives, and polyether adhesives. These pressure-sensitive adhesives may be used alone or in combination of two or more adhesives.

Figure 12:
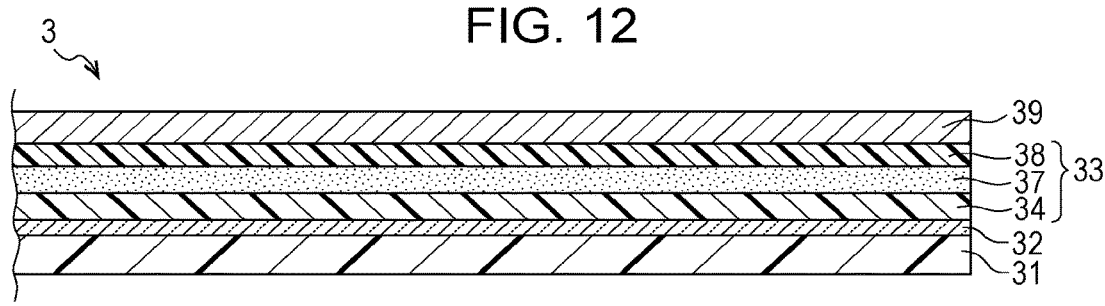
FIG. 12 is a sectional view illustrating another embodiment of a photosensitive conductive film.

(2) Alternatively, in the embodiment described in (1) above, for example, as illustrated in FIG. 12, an intermediate resin layer 33 may further include, in addition to an ultraviolet absorber layer 37, a non-photosensitive resin layer 38 that is stacked on a side of a photosensitive resin layer 34, the side being opposite to a transparent conductive film 32. In this case, considering adhesiveness between the transparent substrate 10 and the non-photosensitive resin layer 38, the photosensitive resin layer 34, the ultraviolet absorber layer 37, and the non-photosensitive resin layer 38 are preferably stacked in that order. The non-photosensitive resin layer 38 is preferably, for example, a resin layer (thermoplastic resin layer) that is softened when heated to a temperature equal to or more than a glass transition temperature or melting point thereof and that is hardened when cooled to a temperature less than the glass transition temperature or melting point thereof. This structure is advantageous in that the non-photosensitive resin layer 38 is easily allowed to adhere to the transparent substrate 10 during thermal lamination in the adhesion step. Considering the ease of handling, it is necessary that the photosensitive conductive film 3 have a certain thickness. When the photosensitive conductive film 3 includes the ultraviolet absorber layer 37 and the non-photosensitive resin layer 38 in a separate state, the thickness of the photosensitive resin layer 34 can be reduced by the thicknesses of the ultraviolet absorber layer 37 and the non-photosensitive resin layer 38. As a result, it is possible to realize a reduction in the difference in levels of the transparent electrodes 14 and 24 to be patterned. The non-photosensitive resin layer 38 may be, for example, a layer formed of a pressure-sensitive adhesive having a property of being hardened under pressure and exhibiting tackiness. Also in this case, adhesiveness to the transparent substrate 10 can be ensured, and a reduction in the difference in levels of the transparent electrodes 14 and 24 to be patterned can be realized by reducing the thickness of the photosensitive resin layer 34.

Figure 13:
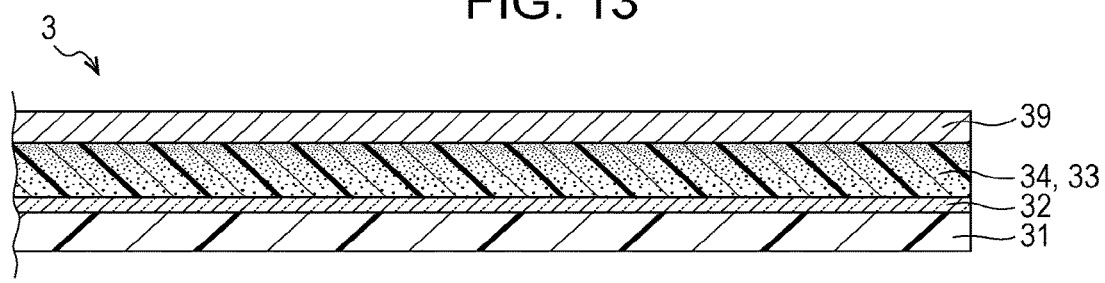
FIG. 13 is a sectional view illustrating another embodiment of a photosensitive conductive film.

(3) In the above embodiment, a description has been made of an example in which, in the intermediate resin layer 33, an ultraviolet absorber is substantially uniformly dispersed and held in the photosensitive resin layer 34. However, embodiments of the present disclosure are not limited thereto. For example, as illustrated in FIG. 13, in an intermediate resin layer 33, an ultraviolet absorber (which is schematically shown by small dots in the figure) may be dispersed and held in a photosensitive resin layer 34 so as to have a concentration gradient. As in the embodiment illustrated in the figure, in the photosensitive conductive film 3, the ultraviolet absorber is preferably dispersed and held so that the concentration of the ultraviolet absorber increases from the transparent conductive film 32 side to the separator 39 side (i.e., the transparent substrate 10 side after the adhesion step).

(4) In the above embodiment, a description has been made of an example in which a photosensitive conductive film 3 containing a negative-type photosensitive resin is used. However, embodiments of the present disclosure are not limited thereto. For example, a photosensitive conductive film 3 containing a positive-type photosensitive resin may be used. In this case, the first mask 41 and the second mask 42 are formed so as to have electrode-forming patterns corresponding to the positive-type photosensitivity.

(5) In the above embodiment, a description has been made of an example in which in order to stack the intermediate resin layer 33 and the transparent conductive film 32 on each of both surfaces of the transparent substrate 10, two photosensitive conductive films 3 are adhered. However, embodiments of the present disclosure are not limited thereto. For example, a material of the transparent conductive film 32 and a material of the intermediate resin layer 33 may be stacked on each of both surfaces of the transparent substrate 10 in the form of a liquid phase.

(6) In the above embodiment, a transparent substrate 10 having an ultraviolet absorption function may be used. In this case, exposure interference can be more reliably suppressed by the synergistic effect with the ultraviolet absorber contained in the intermediate resin layer 33. Such a transparent substrate 10 having an UV-cut function can be obtained by incorporating the ultraviolet absorber described in the above embodiment in the material that forms the transparent substrate 10.

(7) In the above embodiment, a description has been made of an example in which the first transparent electrodes 14 and the second transparent electrodes 24 have a shape formed by connecting a plurality of rhombic electrodes together. However, embodiments of the present disclosure are not limited thereto. The first transparent electrodes 14 and the second transparent electrodes 24 may each be formed, for example, so as to have a stripe shape (linear shape having a uniform width), a wavy shape, or a zigzag shape. The shapes of the window portions (light-transmitting portions) of the first mask 41 and the second mask 42 are determined in accordance with the shapes of the first transparent electrodes 14 and the second transparent electrodes 24 in plan view.

(8) In the above embodiment, a description has been made of an example in which the ultraviolet absorber contained in the intermediate resin layer 33 is deactivated by heat treatment. However, embodiments of the present disclosure are not limited thereto. For example, the ultraviolet absorber may be deactivated by a high-energy UV treatment including irradiation with ultraviolet rays having a shorter wavelength than the ultraviolet rays L radiated in the pattern exposure step.

(9) In the above embodiment, a description has been made of an example in which in the developing step, wet developing is performed by using a developing solution. However, embodiments of the present disclosure are not limited thereto. For example, dry developing, which is a developing treatment including contact with a developing gas such as oxygen plasma, may be performed.

(10) It is to be understood that, with regard to other configurations, embodiments disclosed herein are only examples in all respects. Accordingly, persons skilled in the art can make various modifications as required without departing from the gist of the present disclosure.

Summary of Embodiments

In summary, a method for producing a touch input sensor according to the present disclosure preferably includes configurations described below.

[1] A method for producing a touch input sensor (1) includes stacking an intermediate resin layer (33) containing a photosensitive resin and an ultraviolet absorber and a transparent conductive film (32) on both surfaces of a transparent substrate (10) in that order from the transparent substrate (10) side; disposing a mask (41, 42) so as to cover the intermediate resin layer (33) and the transparent conductive film (32) on both surface sides, and performing a pattern exposure with ultraviolet rays (L) applied to both surface sides; and performing developing to form a transparent electrode (14, 24) formed of the transparent conductive film (32) on both surfaces of the transparent substrate (10).

According to this configuration, an intermediate resin layer and a transparent conductive film are stacked on both surfaces of a transparent substrate, and a pattern exposure is then performed. In this pattern exposure, the alignment of two masks can be relatively easily performed with a high accuracy. Thus, it is also possible to easily perform the alignment of a pair of transparent electrodes that are separately obtained on both surfaces of the transparent substrate after the development.

In the above configuration, the intermediate resin layer containing a photosensitive resin and disposed on both surfaces of the transparent substrate further contains an ultraviolet absorber. Therefore, the mutual effect between patterning of one of a pair of transparent electrodes and patterning of the other of the pair of transparent electrodes can be suppressed. More specifically, ultraviolet rays for patterning the one transparent electrode on one surface (hereinafter referred to as "first surface") side of the transparent substrate are absorbed by the ultraviolet absorber and are hardly transmitted to the other surface (hereinafter referred to as "second surface") side. Similarly, ultraviolet rays for patterning the other transparent electrode on the second surface side of the transparent substrate are absorbed by the ultraviolet absorber and are hardly transmitted to the one surface side. Thus, patterning of a pair of transparent electrodes that are separately obtained on both surfaces of the transparent substrate can be appropriately performed. The number of exposure steps is small, and the apparatus is not substantially limited as long as an exposure can be performed from both surface sides. Accordingly, a pair of transparent electrodes can be easily formed, and the production of a touch input sensor can be simplified.

[2] In the intermediate resin layer (33), the ultraviolet absorber may be dispersed and held in a photosensitive resin layer (34).

According to this configuration, the intermediate resin layer containing a photosensitive resin and an ultraviolet absorber can be easily formed by dispersing the ultraviolet absorber in the photosensitive resin layer. Furthermore, in the pattern exposure, due to the dispersed and held ultraviolet absorber, curing of the photosensitive resin layer on the deep layer side (transparent substrate side) becomes insufficient compared with the surface layer side (transparent conductive film side), and an undercut shape is easily formed. Therefore, during the subsequent development, the transparent conductive film and only a part of the photosensitive resin layer on the surface layer side are removed, and the difference in level between transparent electrodes and non-electrode portions can be suppressed to be small. Accordingly, visual recognition of the patterns of the transparent electrodes can be suppressed.

[3] The method may further include after the development, deactivating the ultraviolet absorber contained in the intermediate resin layer (33), and after the deactivation of the ultraviolet absorber, exposing a whole surface of the intermediate resin layer (33) on both surface sides.

According to this configuration, after the pattern exposure and the development, the ultraviolet absorber is deactivated, and the whole surface of the intermediate resin layer on both surface sides is then exposed. Accordingly, patterned portions and uncured portions in the intermediate resin layer can be completely cured without being affected by the ultraviolet absorber. Therefore, even in the case of using an intermediate resin layer in which an ultraviolet absorber is dispersed and held in a photosensitive resin layer, complete curing of the whole intermediate resin layer can be appropriately performed, and a touch input sensor having an appropriate performance can be obtained.

[4] The ultraviolet absorber may be dispersed and held in the photosensitive resin layer (34) so as to have a concentration gradient in which the concentration of the ultraviolet absorber increases from the transparent conductive film (32) side to the transparent substrate (10) side.

According to this configuration, during the pattern exposure, most part of the intermediate resin layer on the transparent conductive film side can be appropriately cured, and transmission of ultraviolet rays to the opposite side with respect to the transparent substrate can be effectively suppressed.

[5] In the intermediate resin layer (33), a photosensitive resin layer (34) and an ultraviolet absorber layer (37) may be stacked so that the photosensitive resin layer (34) is located on the transparent conductive film (32) side.

According to this configuration, the intermediate resin layer containing a photosensitive resin and an ultraviolet absorber can be easily formed by separately forming a photosensitive resin layer and an ultraviolet absorber layer and stacking these layers. Since the layers are stacked so that the photosensitive resin layer is located on the transparent conductive film side and the ultraviolet absorber layer is located on the transparent substrate side, the photosensitive resin layer can be appropriately cured during the pattern exposure, and transmission of ultraviolet rays to the opposite side with respect to the transparent substrate can be effectively suppressed. In addition, when the intermediate resin layer has a certain thickness, the thickness of the photosensitive resin layer can be suppressed to be small in accordance with the thickness of the ultraviolet absorber layer. Therefore, the difference in level between transparent electrodes and non-electrode portions can be suppressed to be small after the pattern exposure step and the subsequent developing. Accordingly, visual recognition of the patterns of the transparent electrodes can be suppressed.

[6] The intermediate resin layer (33) may further include a non-photosensitive resin layer (38) stacked on a side of the ultraviolet absorber layer (37), the side being opposite to the photosensitive resin layer (34).

According to this configuration, when the intermediate resin layer has a certain thickness, the thickness of the photosensitive resin layer can be further suppressed to be small in accordance with the thicknesses of the non-photosensitive resin layer and the ultraviolet absorber layer. Therefore, the difference in level between transparent electrodes and non-electrode portions can be further suppressed to be small. Accordingly, visual recognition of the patterns of the transparent electrodes can be effectively suppressed.

A photosensitive conductive film according to the present disclosure preferably includes configurations described below.

[7] A photosensitive conductive film (3) includes a base film (31); a transparent conductive film (32) disposed on the base film (31); and a photosensitive layer (33) having a UV-cut function, the photosensitive layer (33) being disposed on the transparent conductive film (32) and containing a photosensitive resin and an ultraviolet absorber.

By adhering two photosensitive conductive films each having the above structure to both surfaces of a transparent substrate so that the photosensitive layer having a UV-cut function is in contact with both surfaces of the transparent substrate, a laminate is formed in which the photosensitive layer having a UV-cut function and the transparent conductive film are stacked on both surfaces of the transparent substrate in that order from the transparent substrate side. A mask is disposed so as to cover the photosensitive layer having a UV-cut function and the transparent conductive film on both surface sides of the laminate, and a pattern exposure is performed from both surface sides. Accordingly, it is possible to easily perform the alignment of a pair of transparent electrodes that are separately obtained on both surfaces of the transparent substrate after development.

In the above configuration, the photosensitive layers having a UV-cut function, the photosensitive layers being disposed on both surfaces of the transparent substrate and containing a photosensitive resin, further contain an ultraviolet absorber. Therefore, the mutual effect between patterning of one of a pair of transparent electrodes and patterning of the other of the pair of transparent electrodes can be suppressed. Thus, the patterning of a pair of transparent electrodes that are separately obtained on both surfaces of the transparent substrate can be appropriately performed. The number of exposure steps is small, and the apparatus is not substantially limited as long as an exposure can be performed from both surface sides. Accordingly, a pair of transparent electrodes can be easily formed, and the production of a touch input sensor can be simplified.

Accordingly, it is possible to provide a photosensitive conductive film suitable for a method for producing a touch input sensor, the method being capable of simply producing a touch input sensor and easily aligning a pair of transparent electrodes with each other.

The photosensitive conductive film is also preferably provided with the suitable configurations ([2] and [4] to [6]) described with regard to the method for producing a touch input sensor. In this case, the term "the transparent substrate (10) side" in the configuration of [4] above is read as "the side opposite to the base film (31)".

It is sufficient that at least one of the advantages described above can be achieved by the photosensitive conductive film and the method for producing a touch input sensor according to the present disclosure.

The technologies according to the present disclosure can be used for, for example, forming a pair of transparent electrodes in the production of a touch input sensor.

The invention claimed is:

1. A method for producing a touch input sensor, comprising:
    stacking an intermediate resin layer, containing a photosensitive resin and an ultraviolet absorber, and a transparent conductive film on both surfaces of a transparent substrate in that order from the transparent substrate side;
    disposing a mask so as to cover the intermediate resin layer and the transparent conductive film on both surface sides, and performing a pattern exposure with ultraviolet rays applied to both surface sides; and
    performing developing to form a transparent electrode formed of the transparent conductive film on both surfaces of the transparent substrate.

2. The method according to claim 1, wherein in the intermediate resin layer, the ultraviolet absorber is dispersed and held in a photosensitive resin layer.

3. The method according to claim 2, further comprising:
    after the development, deactivating the ultraviolet absorber contained in the intermediate resin layer; and
    after the deactivation of the ultraviolet absorber, exposing a whole surface of the intermediate resin layer on both surface sides.

4. The method according to claim 3, wherein the ultraviolet absorber is dispersed and held in the photosensitive resin layer so as to have a concentration gradient in which the concentration of the ultraviolet absorber increases from the transparent conductive film side to the transparent substrate side.

5. The method according to claim 4, wherein
    the stacking stacks a photosensitive conductive film on both surfaces of the transparent substrate, the photosensitive conductive film comprising a detachable base film, the transparent conductive film disposed on the base film, and a photosensitive layer having a UV-cut function, the photosensitive layer being disposed on the transparent conductive film and containing the photosensitive resin and the ultraviolet absorber, and
    the performing the developing is performed in a state where the detachable base film is detached.

6. The method according to claim 2, wherein the ultraviolet absorber is dispersed and held in the photosensitive resin layer so as to have a concentration gradient in which the concentration of the ultraviolet absorber increases from the transparent conductive film side to the transparent substrate side.

7. The method according to claim 6, wherein
    the stacking stacks a photosensitive conductive film on both surfaces of the transparent substrate, the photosensitive conductive film comprising a detachable base film, the transparent conductive film disposed on the base film, and a photosensitive layer having a UV-cut function, the photosensitive layer being disposed on the transparent conductive film and containing the photosensitive resin and the ultraviolet absorber, and
    the performing the developing is performed in a state where the detachable base film is detached.

8. The method according to claim 1, wherein in the intermediate resin layer, a photosensitive resin layer and an ultraviolet absorber layer are stacked so that the photosensitive resin layer is located on the transparent conductive film side.

9. The method according to claim 8, wherein the intermediate resin layer further includes a non-photosensitive resin layer stacked on a side of the ultraviolet absorber layer, the side being opposite to the photosensitive resin layer.

10. The method according to claim 1, wherein
    the stacking stacks a photosensitive conductive film on both surfaces of the transparent substrate, the photosensitive conductive film comprising a detachable base film, the transparent conductive film disposed on the base film, and a photosensitive layer having a UV-cut function, the photosensitive layer being disposed on the transparent conductive film and containing the photosensitive resin and the ultraviolet absorber, and
    the performing the developing is performed in a state where the detachable base film is detached.

* * * * *